(12) United States Patent
Hashimoto

(10) Patent No.: US 9,754,782 B2
(45) Date of Patent: Sep. 5, 2017

(54) GROUP III NITRIDE SUBSTRATES AND THEIR FABRICATION METHOD

(71) Applicants: SIXPOINT MATERIALS, INC., Buellton, CA (US); SEOUL SEMICONDUCTOR CO., LTD., Seoul (KR)

(72) Inventor: Tadao Hashimoto, Santa Barbara, CA (US)

(73) Assignee: SixPoint Materials, Inc., Buellton, CA (US)

(*) Notice: Subject to any disclaimer, the term of this patent is extended or adjusted under 35 U.S.C. 154(b) by 37 days.

(21) Appl. No.: 14/959,476

(22) Filed: Dec. 4, 2015

(65) Prior Publication Data

US 2016/0163801 A1    Jun. 9, 2016

Related U.S. Application Data

(60) Provisional application No. 62/087,746, filed on Dec. 4, 2014.

(51) Int. Cl.
*H01L 29/20* (2006.01)
*H01L 29/04* (2006.01)
(Continued)

(52) U.S. Cl.
CPC .... *H01L 21/02389* (2013.01); *H01L 21/0254* (2013.01); *H01L 21/02433* (2013.01);
(Continued)

(58) Field of Classification Search
None
See application file for complete search history.

(56) References Cited

U.S. PATENT DOCUMENTS 5,413,067 A     5/1995   Zarka et al.
6,051,849 A *   4/2000   Davis .................. H01L 21/0237
                                                       257/103
(Continued)

FOREIGN PATENT DOCUMENTS

WO    WO2005122267 A2    12/2005
WO    WO2016090223 A1     6/2016

OTHER PUBLICATIONS

PCT/US2015/063937 International Search Report and Written Opinion dated May 23, 2016, pp. 17.
(Continued)

*Primary Examiner* — David Sample
*Assistant Examiner* — Donald M Flores, Jr.
(74) *Attorney, Agent, or Firm* — Strategic Innovation IP Law Offices, P.C.

(57) ABSTRACT

Group III nitride substrate having a first side of nonpolar or semipolar plane and a second side has more than one stripe of metal buried, wherein the stripes are perpendicular to group III nitride's c-axis. More than 90% of stacking faults exist over metal stripes. Second side may expose a nonpolar or semipolar plane. Also disclosed is a group III nitride substrate having a first side of nonpolar or semipolar plane and a second side with exposed nonpolar or semipolar plane. The substrate contains bundles of stacking faults with spacing larger than 1 mm. The invention also provides methods of fabricating the group III nitride substrates above.

13 Claims, 5 Drawing Sheets

(51) Int. Cl.
*H01L 21/02* (2006.01)
*H01L 21/78* (2006.01)
*H01L 21/324* (2006.01)
*H01L 21/304* (2006.01)

(52) U.S. Cl.
CPC ........ *H01L 21/304* (2013.01); *H01L 21/3245* (2013.01); *H01L 21/78* (2013.01); *H01L 29/045* (2013.01); *H01L 29/2003* (2013.01); H01L 21/02634 (2013.01)

(56) References Cited

U.S. PATENT DOCUMENTS

| | | | |
|---|---|---|---|
| 7,078,731 B2 * | 7/2006 | D'Evelyn | B82Y 10/00 257/103 |
| 7,132,730 B2 | 11/2006 | Dwilinski et al. | |
| 8,236,237 B2 | 8/2012 | Elson et al. | |
| 8,492,185 B1 | 7/2013 | D'Evelyn et al. | |
| 8,764,903 B2 | 7/2014 | Hashimoto et al. | |
| 9,673,044 B2 | 6/2017 | Hashimoto | |
| 2006/0084245 A1 * | 4/2006 | Kohda | H01L 21/0237 438/478 |
| 2009/0309105 A1 * | 12/2009 | Letts | C30B 7/10 257/76 |
| 2011/0108954 A1 | 5/2011 | Spiberg et al. | |
| 2012/0034763 A1 | 2/2012 | Osada et al. | |
| 2012/0063987 A1 | 3/2012 | Pimputkar et al. | |
| 2012/0119218 A1 * | 5/2012 | Su | C30B 25/18 257/76 |
| 2013/0323490 A1 | 12/2013 | D'Evelyn et al. | |
| 2014/0087113 A1 | 3/2014 | Hashimoto et al. | |
| 2014/0147650 A1 * | 5/2014 | Jiang | H01L 21/0237 428/220 |
| 2016/0017515 A1 | 1/2016 | Han | |
| 2016/0163541 A1 | 6/2016 | Hashimoto | |

OTHER PUBLICATIONS

U.S. Appl. No. 14/959,565 Official Action dated Jul. 5, 2016.
U.S. Appl. No. 14/959,565 Office Action dated Dec. 15, 2016.
U.S. Appl. No. 14/959,565 Amendment dated Sep. 26, 2016.
U.S. Appl. No. 14/959,565 Amendment dated Mar. 15, 2017.
U.S. Appl. No. 14/959,565 Notice of Allowability dated Apr. 4, 2017.

* cited by examiner

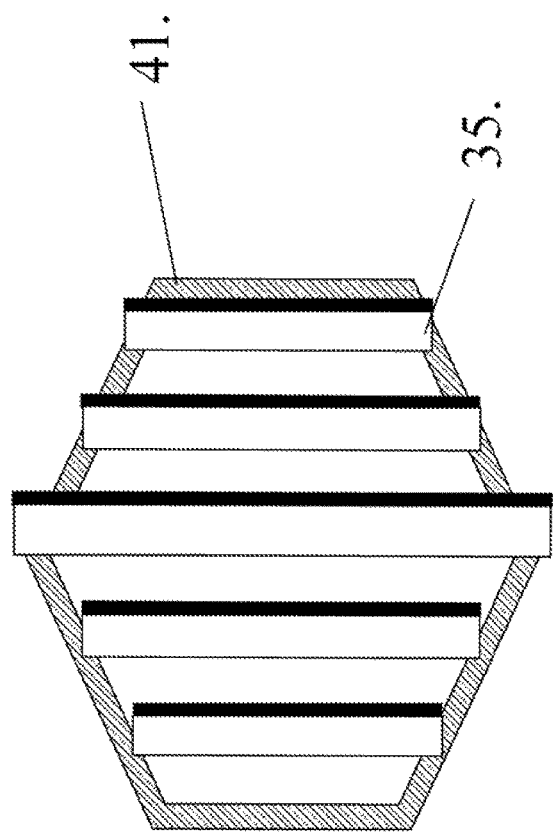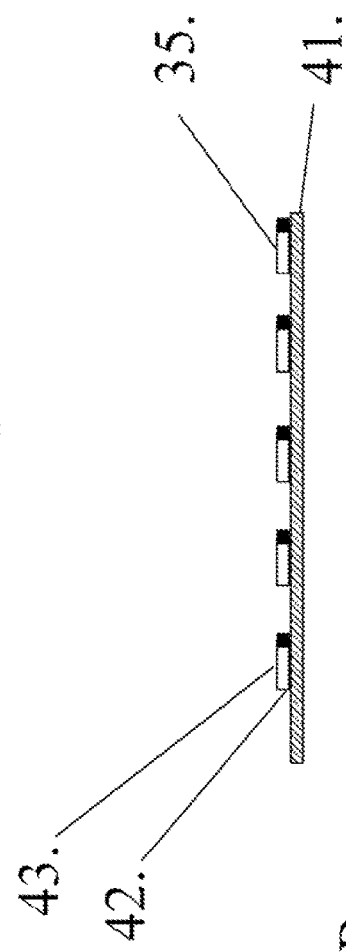
FIG. 4A
FIG. 4B

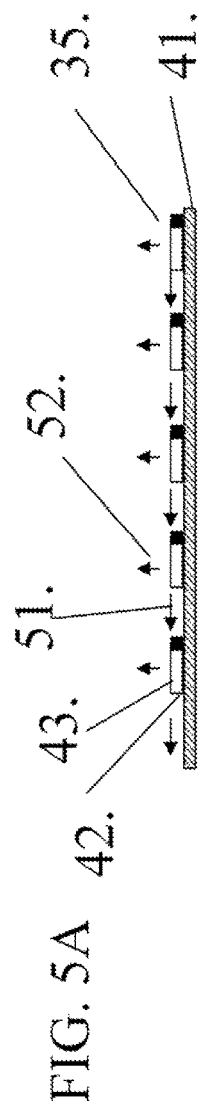
FIG. 5A
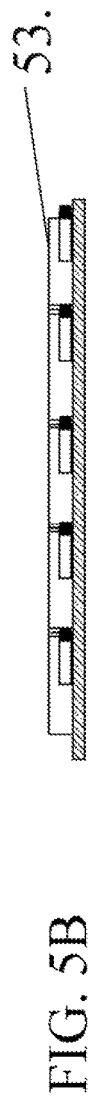
FIG. 5B
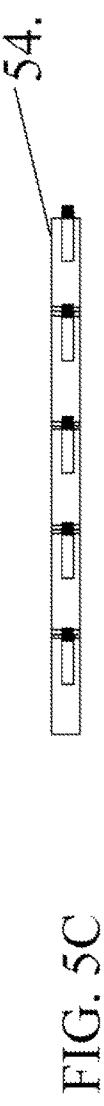
FIG. 5C
FIG. 5D
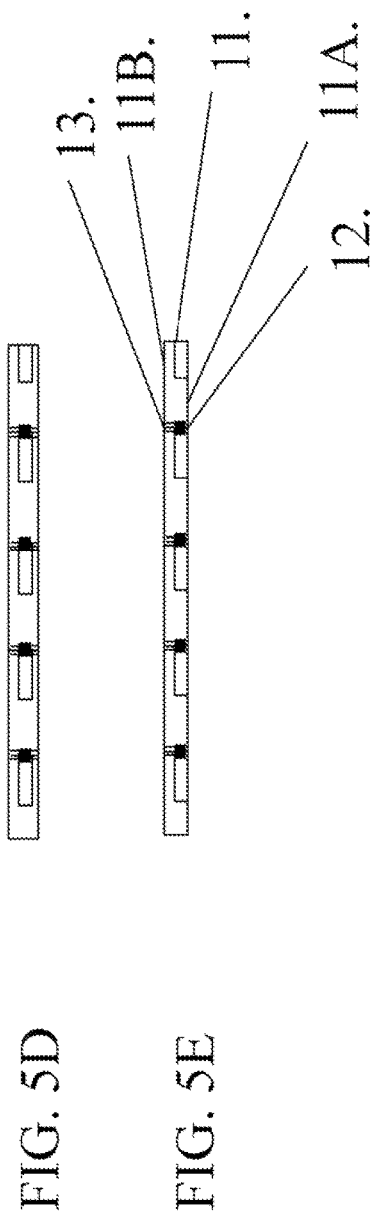
FIG. 5E

GROUP III NITRIDE SUBSTRATES AND THEIR FABRICATION METHOD

CROSS REFERENCE TO RELATED APPLICATIONS

This application claims the benefit of priority to U.S. patent application Ser. No. 62/087,746 filed Dec. 4, 2014, entitled "Group III Nitride Substrates And Their Fabrication Method," inventor Tadao Hashimoto, the contents of which are incorporated by reference in their entirety herein.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL," and issued as U.S. Pat. No. 8,236,237;

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility Patent Application Ser. No. 61/106,110, filed on Oct. 16, 2008, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility Patent Application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility Patent Application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

which applications are incorporated by reference herein in their entirety as if put forth in full below.

BACKGROUND

Field of the Invention

The invention relates to a substrate of semiconductor material used to produce semiconductor devices including optoelectronic devices such as light emitting diodes (LEDs) and laser diodes (LDs), and electronic devices such as transistors. More specifically, the invention provides substrates of group III nitride such as gallium nitride. The invention also provides methods of making these substrates.

Description of the Existing Technology

This document refers to several publications and patents as indicated with numbers within brackets, e.g., [x]. Following is a list of these publications and patents:

[1] Philippe Spiberg, et al., U.S. Patent Pub. No. 2011/0108954A1.

[2] R. Dwilinski, et al., U.S. Pat. No. 7,132,730B2.

[3] H. Osada, et al., U.S. Patent Pub. No. 2012/0034763 A1

Each of the references listed in this document is incorporated by reference in its entirety as if put forth in full herein, and particularly with respect to their description of methods of making and using group III nitride substrates.

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. Recently, researchers have demonstrated GaN with m-plane (nonpolar), a-plane (nonpolar), angled m-plane (semipolar), or angled a-plane (semipolar) shows higher indium incorporation when solid solution of InGaN is grown. Higher indium content is required to fabricate light emitting devices with longer wavelength such as green, amber and even red.

To obtain such nonpolar and semipolar substrates, there are a few approaches. One is to use non-c-plane heterogeneous substrate such as r-plane sapphire, m-plane silicon carbide to grow GaN by vapor phase epitaxy [1]. Since large diameter (>2") wafers of these materials are commercially available, it is relatively easy to obtain large-area nonpolar/semipolar GaN on such substrates. For example, a-plane GaN can be grown on r-plane sapphire and m-plane GaN can be grown on m-plane SiC. Similarly, some researchers proposed to use a patterned c-plane sapphire substrate to obtain non-polar/semipolar GaN. This approach also provides relatively large-area nonpolar/semipolar GaN layers. However, these approaches inevitably introduce basal plane stacking fault, which propagates parallel to c-plane of GaN. Typical density of the stacking faults are $10^5$ cm$^{-1}$, which means the average spacing of the stacking faults is 0.1 microns. Scientists have proven that the stacking faults become non-radiative recombination center, thus optical devices fabricated on such material does not have high efficiency.

To obtain high-quality nonpolar/semipolar GaN substrates with less stacking faults, people grow bulk crystal of GaN along c-axis direction and slice the crystal along the desired orientation such as m-plane and semipolar planes [2]. Since growth along c-axis does not introduce stacking faults, people can obtain practically stacking fault-free crystal in this approach. However, when m-plane wafers are sliced from a bulk GaN crystal, the slicing direction is perpendicular to the c-plane, thus the size of the sliced wafer is limited by the thickness of the bulk GaN crystal. This situation is similar for other nonpolar/semipolar orientations. Thus, this approach typically provides long strips of wafers. For example, if 2" diameter×5 mm thick bulk GaN crystal is sliced to obtain m-plane wafers, the largest piece one can obtain is a 2"×5 mm rectangular strip. Although this strip contains negligible amount of stacking faults, the shape and size is not favorable for commercial application.

One method to obtain large-area nonpolar/semipolar wafer using the strips explained above is to tile these strips and grow GaN on the exposed nonpolar/semipolar surface to fuse these strips together [3]. However, this method has a problem of growing polycrystalline along the gap between two strips, therefore, crystal quality is typically poor.

SUMMARY OF THE INVENTION

In one instance, the invention provides a group III nitride substrate having a first side of nonpolar or semipolar plane and a second side opposite to the first side has more than one stripe of metal buried wherein the direction of the stripes is perpendicular to the c-axis of the group III nitride. Preferably more than 80%, and more preferably more than 90%, of stacking faults exist over the metal stripes.

In one instance, the invention provides a group III nitride substrate having a first side of nonpolar or semipolar plane and a second side opposite to the first side exposes a nonpolar or semipolar plane. The substrate has more than one stripes of metal buried inside the substrate wherein the direction of the stripes is perpendicular to the c-axis of the group III nitride. Preferably more than 80%, and more preferably more than 90%, of stacking faults exist over the metal stripes.

In one instance, the invention provides a group III nitride substrate having a first side of nonpolar or semipolar plane and a second side opposite to the first side exposes a nonpolar or semipolar plane. The substrate contains bundles of stacking faults with spacing of the bundles larger than 1 mm. In other instances, the bundles may be spaced apart by at least 1.5, 2.0, 2.5, 3, 3.5, 4, 4.5, or 5 mm in order to provide large, cluster-free regions in which an electronic device can be formed.

The invention also provides methods of fabricating the group III nitride substrate. One such method comprises growing a group III nitride bulk crystal along the c-direction, covering the group III polar c-plane with metal, slicing the group III nitride bulk crystal along nonpolar or semipolar direction to obtain plurality of strips, fixing the strips on a frame with keeping a certain spacing and the same crystallographic planes aligned to the same direction, and growing group III nitride crystal in supercritical ammonia. During growth in the supercritical ammonia, group III nitride crystal grows on the nitrogen polar c-planes with optional growth on the nonpolar/semipolar planes. The growth along –c direction fuses the strips together to make one piece of wafer.

BRIEF DESCRIPTION OF THE DRAWINGS

Referring now to the drawings in which like reference numbers represent corresponding parts throughout.

In the figure each number represents the followings:
11. A group III nitride substrate,
11A. A first side of the substrate exposing nonpolar/semipolar surface,
11B. A second side opposite to the first side,
12. A metal stripe,
13. A bundle of stacking faults.

Figure 2:
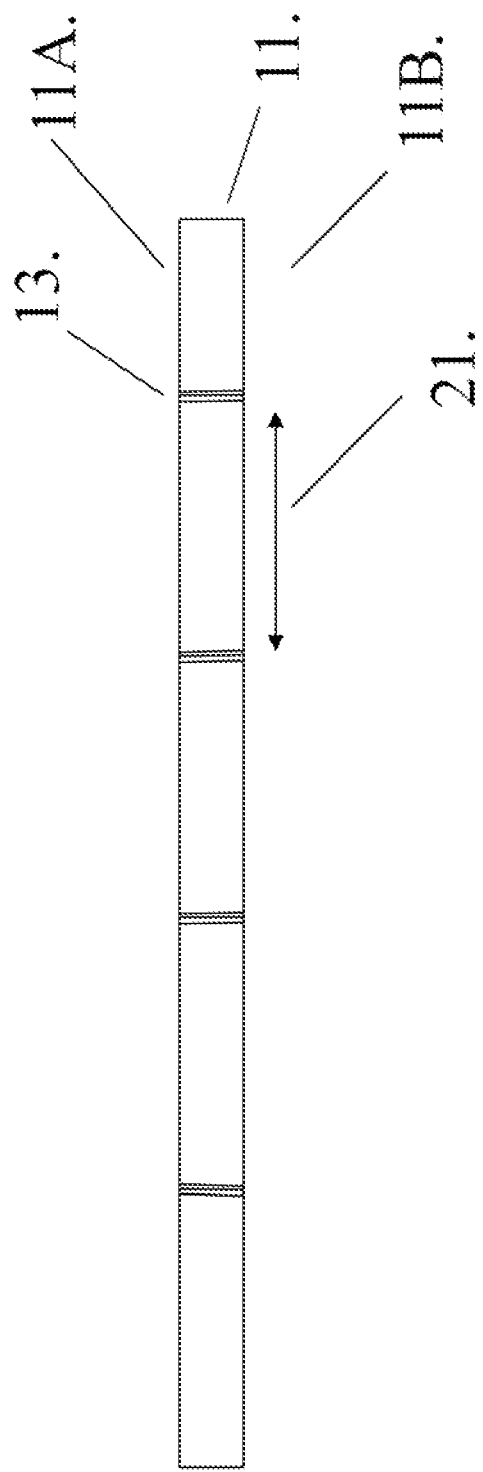

FIG. 2 is a schematic cross-sectional drawing of a group III nitride substrate.

In the figure each number represents the followings:
11. A group III nitride substrate,
11A. A first side of the substrate exposing nonpolar/semipolar surface,
11B. A second side opposite to the first side,
13. A bundle of stacking faults.
21. Spacing of bundles of stacking faults FIG. 3A through 3D is an example of part of steps to fabricate a group III nitride substrate.

In the figure each number represents the followings:
31. A c-plane seed crystal,
31A. A nitrogen polar c-plane,
31B. A group III polar c-plane,
32. Metal covering a group III polar c-plane,
33. A group III nitride bulk crystal grown on the nitrogen polar c-plane,
34. A line of slicing,
35. A strip of nonpolar/semipolar wafer.

FIGS. 4A and 4B are schematic drawings of fixing nonpolar/semipolar strips on a frame. FIG. 4A is a top view and FIG. 4B is a side view.

In the figure each number represents the followings:
35. A strip of nonpolar/semipolar wafer.
41. A frame,
42. An exposed nitrogen polar c-plane,
43. An exposed nonpolar/semipolar plane.

FIG. 5A through 5E is an example of part of steps to fabricate a group III nitride substrate. These figures are side views.

In the figure each number represents the followings:
11. A group III nitride substrate,
11A. A first side of the substrate exposing nonpolar/semipolar surface,
11B. A second side opposite to the first side,
12. A metal stripe,
13. A bundle of stacking faults.
41. A frame,
42. An exposed nitrogen polar c-plane,
43. An exposed nonpolar/semipolar plane.
51. Growth direction for nitrogen polar group III nitride plane,
52. Growth direction for nonpolar/semipolar group III nitride plane,
53. A piece of group III nitride crystal on a frame after growth,
54. A piece of group III nitride crystal removed from the frame, 55. Group III nitride substrate obtained from the piece of group III nitride crystal,

DETAILED DESCRIPTION OF THE INVENTION

Overview

The group III nitride substrate of the present invention is typically used for optoelectronic and electronic devices. For special properties such as longer wavelength emission, a group III nitride substrate having nonpolar or semipolar orientations are preferred. Typical nonpolar orientations are m{10-10} planes and a{11-20} plane, and typical semipolar orientations are {11-22}, {11-2-2}, {10-13}, {10-1-3}, {20-21}, and {20-2-1} planes. This invention can also provide a substrate with other nonpolar/semipolar orientations.

The group III nitride substrate in this invention provides a large-area substrate having a suitable nonpolar/semipolar surface for device fabrication. A method of fabricating the substrate involves growing a group III nitride bulk crystal on a c-plane, covering the group III polar c-plane with metal, slicing the group III nitride bulk crystal to obtain strips of nonpolar/semipolar orientations, re-aligning the strips with maintaining a certain spacing, followed by growth in supercritical ammonia. This way, generation of polycrystals during crystal growth is minimized. Stacking faults primarily exist as bundles over the metal strips, thus providing a larger usable area for devices.

Technical Description of the Invention

The invention in one instance provides a new group III nitride substrate. The substrate has a nonpolar or semipolar surface on which a device such as an LED and/or LD can be formed. The substrate has a plurality of regions with clusters (bundles) of stacking faults. The substrate also has open regions between clusters that are free of bundles of stacking faults, and these regions are sufficiently large that an electronic device such as an LED or LD can be formed without intersecting a bundle of stacking faults. Preferably, the open regions have relatively few stacking faults in those regions, with e.g. at least 80% or at least 90% of the stacking faults being clustered outside of the open regions. An LED or LD fabricated in an open region can therefore have better efficiency than an LED or LD fabricated on a comparative substrate that is otherwise identical but does not have bundles of stacking faults.

Figure 1:
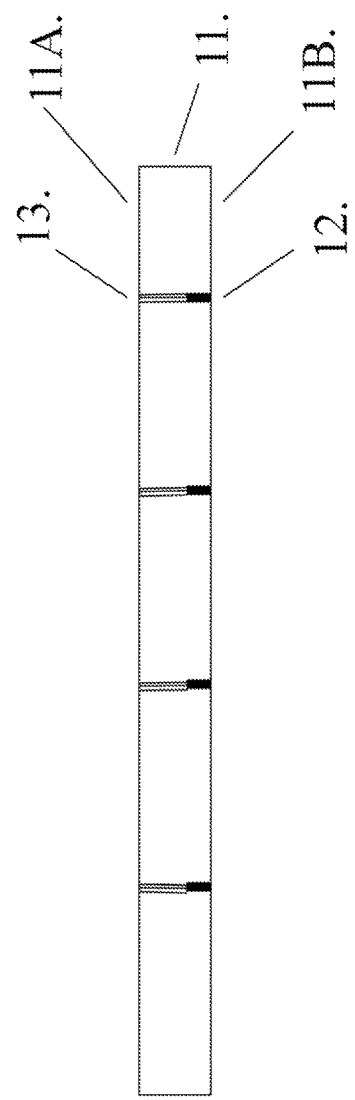
FIG. 1 is a schematic cross-sectional drawing of a group III nitride substrate.

FIG. 1 shows a schematic of one group III nitride substrate (11) according to the invention. A first side (11A) exposes a nonpolar or semipolar surface with a miscut angle less than +/−5 degrees. The miscut is sometimes preferred to obtain higher crystal quality and surface smoothness after epitaxial growth. The miscut angle can be along +c direction, −c direction or directions perpendicular to the c direction. The crystal has a second side (11B) opposite to the first side which may expose metal strips aligned perpendicular to the c-axis. As shown in FIG. 5D, the substrate may have a second side exposing a nonpolar/semipolar plane. In this case, metal stripes are embedded inside the substrate. In another instance the portion of the metal may be completely removed so that only nonpolar/semipolar surfaces are exposed on the first and second side, and metal stripes do not exist in the substrate as shown in FIG. 2. In this case, bundles of stacking faults remain in the substrate with spacing larger than 1 mm or preferably 5 mm.

The substrate in this invention is large enough for practical device fabrication. Since the stacking faults are bundled in a limited region, usable area for device fabrication is also sufficient for practical use. The surface on the first side is used for epitaxial growth and is typically polished to achieve epi-ready condition. Conventional grinding, lapping and chemical mechanical polishing (CMP) are used to polish the surface. The second side may be polished or may be left unpolished. The substrate may be round shape, rectangular shape, square shape, hexagonal shape or other shapes. Also, the substrate may have one or more orientation flats to identify crystallographic orientations. Due to bending of crystal lattice inside the strips used to fabricate the substrate, the substrate may have in-plane lattice bending, which discontinues at the bundles of stacking faults. The substrate may be electrically conductive (n-type or p-type) or semi-insulating, depending of the application.

In another instance, the invention provides a new method of forming a substrate of this invention. The method involves placing group III nitride pieces so that fast-growing edges of the pieces face one another across a gap, and growing group III nitride on one but not the other of the fast-growing edges facing one another in order to fill the gap with group III nitride. The method may also comprise continuing to grow group III nitride to merge the pieces into a single substrate, and growing additional group III nitride on a face formed by the merged strips. Piece edges may be masked individually to prevent growth on one or more edges, or a substrate may be masked and then cut into pieces to provide an edge on which group III nitride does not grow. The group III nitride may be grown by an ammonothermal method such as an ammonobasic or an ammonoacidic method, and preferably the pieces are at least merged into a single substrate using either of these ammonothermal methods. Additional group III nitride may be grown on a face formed by the merged pieces using an ammonothermal method (basic or acidic), and/or additional group III nitride may be grown on the face via a fast-growth method such as vapor-phase epitaxy (e.g. HVPE, MOCVD), MBE, a flux method, high-pressure solution growth or sputtering.

The invention also provides pieces having an edge masked with e.g. a metal to prevent growth of group III nitride on that edge. The masked edge may be one that is fast-growing in an ammonothermal method, particularly an ammonobasic method or an ammonoacidic method. A plurality of these pieces can be used in practicing a method according to the invention. The pieces may be in the form of strips cut from a substrate.

FIG. 3A through 3D shows a part of one fabrication method for a substrate of this invention. First, a seed crystal (31) is prepared. If ammonothermal growth is used to grow a group III nitride bulk crystal on the seed, the seed crystal (31) is preferably group III nitride. If a growth method which is compatible with heterogeneous substrates such as sapphire, silicon carbide (SiC), gallium arsenide (GaAs), or silicon (Si) is used to grow a bulk crystal of group III nitride, the seed crystal (31) can be such heterogeneous substrate. Hydride vapor phase epitaxy (HVPE), flux method, or high-pressure solution growth are examples of growth method compatible with heterogeneous substrates. In any case, the seed crystal should be suitable to grow group III nitride along c-axis direction without introducing stacking faults. In the case of group III nitride seed, c-plane GaN or c-plane AlN may be used. In the case of heterogeneous substrates, c-plane sapphire, c-plane SiC, (111) plane GaAs, or (111) Si may be used.

Figure 3A:
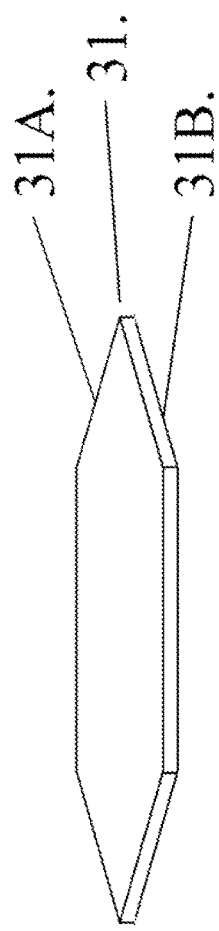
Figure 3B:
Figure 3C:
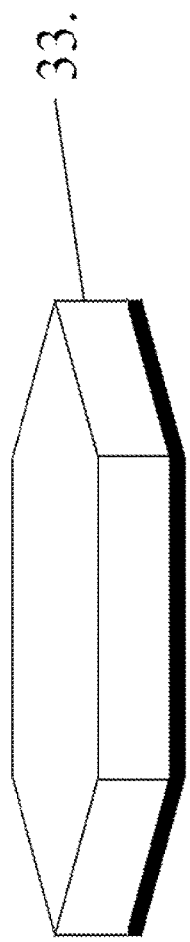

If ammonothermal growth is used to grow a bulk crystal of group III nitride, the group III polar surface of the seed crystal may be masked with metal (32) so that a bulk crystal of group III nitride grows primarily on nitrogen polar c-plane (FIG. 3B). For example, if a bulk crystal of GaN is grown in the ammonothermal method, a single crystalline GaN seed is preferably used. The Ga face of the seed is covered with metal, and bulk GaN crystal is grown on N face of the seed. If other growth methods are used, the group III polar surface may be masked after the bulk growth. (33) shown in FIG. 3C is a bulk crystal of group III nitride with group III polar surface masked with metal. The bulk crystal may be formed using an ammonobasic solution, in which a basic mineralizer such as sodium, lithium, or sodium amide is added to ammonia.

The metal is preferably stable in supercritical ammonia. Vanadium, vanadium alloy, nickel, nickel alloy, silver, or silver alloy are examples of such metal. To place the metal on the group III polar c-plane, vacuum evaporation, sputtering, or plating can be used. The thickness of the mask is preferably between 0.05 to 1000 microns. If the mask is too thin, it will be unstable in the supercritical ammonia. If the mask is too thick, number of stacking faults in the substrate may increase. To avoid peeling of the metal, binding metal such as chromium can be used between the group III polar surface and the metal mask.

Figure 3D:
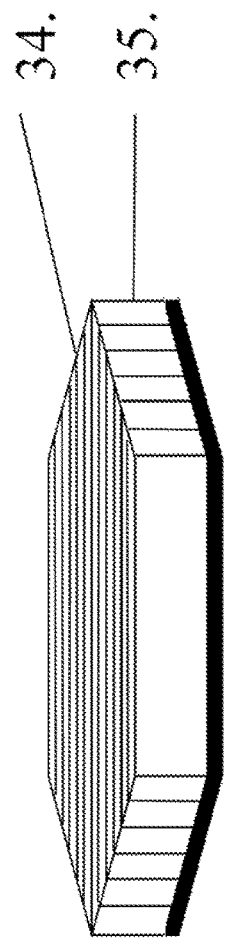

The bulk crystal of group III nitride with the metal mask on its group III polar c-plane is sliced to obtain strips of nonpolar/semipolar wafers (FIG. 3D). Multiple wire saw is preferably used since it can produce many strips in one step. The slicing thickness is preferably about 500 microns, although it can be thinner or thicker. After slicing the bulk crystal, many strips of nonpolar/semipolar wafers are obtained. These wafers are optionally polished on the exposed nonpolar/semipolar planes. Also, nitrogen polar c-plane can be polished, preferably before slicing. These polishing step will expose smooth surfaces on which group III nitride will be crystallized. The polishing helps prevent polycrystalline growth on the exposed surfaces.

In the case of nonpolar planes such as m{10-10} planes or a{11-20} planes, the both sides of the strips are crystallographically identical. However, if miscut is made, one side has a positive miscut angle whereas the other side has a negative miscut angle. Similarly, if the bulk crystal is sliced along semipolar planes such as {11-22}, {11-2-2}, {10-13}, {10-1-3}, {20-21}, {20-2-1} planes, one side becomes group III polar and the other side becomes nitrogen polar. For example (11-22) plane strip has a back side exposing (11-2-2) plane. After producing the strips, extra care should be taken not to mix these orientations. Through these steps, plurality of group III nitride strips with nonpolar/semipolar orientations having exposed nitrogen polar c-plane are obtained.

These strips are now fixed on a holder such as a frame as shown in FIGS. 4A and 4B. FIG. 4A is a top view and FIG. 4B is a side view. Although it is not shown in the figure, the strips are preferably fixed with mechanical means such as screws, clamps, plates or wires. This is because the ammonothermal growth environment is too reactive to allow glues or chemical bonds. Extra care should be taken to align the strips so that crystallographic orientations of each strip matches well. The misalignment angle is preferably less than 1 degree, more preferably less than 0.1 degrees. After this step, only nonpolar/semipolar planes (43) and nitrogen polar c-planes (42) are exposed for further crystal growth.

The holder or frame is preferably made of metal such as vanadium, vanadium alloys, nickel, nickel alloys, silver, or silver alloys, which are compatible with the ammonothermal growth environment. Alternatively, the holder or frame can be made of other material with appropriate coating or lining by the compatible metals listed above. Also, the shape of the frame can be hexagonal, round, or other shapes. The holder does not necessarily have an opening, rather the holder can be a blank plate of appropriate size and shape that has a fastener such as a clasp or grip. In this case, only one side of the nonpolar/semipolar planes is exposed.

The array of nonpolar/semipolar strips fixed on the frame is loaded in an ammonothermal growth reactor and crystal growth is conducted. In the ammonothermal growth using alkali metal mineralizers such as lithium, sodium amide, and/or sodium, group III nitride crystal primarily grow on the nitrogen polar c-planes (42). This growth direction is indicated as the arrow (51). Group III nitride crystal also grows on the exposed nonpolar/semipolar planes (43), of which the growth direction is indicated an arrow (52). Especially, if a-plane or semipolar planes are exposed, the growth rate along the arrow (52) is comparable to that along the arrow (51). In the case of m-plane, growth rate on the m-plane is approximately 1/10 of that of c-plane.

After sufficient growth time, the growth front on the nitrogen polar c-plane reaches the metal surface of the adjacent strip. This way the array of strips forms a piece of group III nitride crystal (53) as shown in FIG. 5B. The coalescence front often causes defects such as stacking faults and dislocations. Thus, stacking faults exists over the metal portion, forming a bundle. A thin layer of InGaN may, if desired, be formed on a major face of the substrate by adding In into the reactor using a high-pressure pump toward the end of crystal growth.

The piece of crystal is then removed from the frame (FIG. 5C). After appropriate shaping of the crystal (54), one obtains a nonpolar/semipolar group III nitride substrate (55) as shown in FIG. 5D. The second side (backside) of the substrate is optionally ground and lapped to expose the metal strips as shown in FIG. 5E. If the metal strip portion is completely removed, one can obtain a nonpolar/semipolar group III nitride substrate shown in FIG. 2.

EXAMPLE 1

A c-plane GaN seed having thickness of about 450 microns is prepared. The seed has a hexagonal shape with flat to flat dimension of approximately 50 mm. The sidewalls of the seed are m-planes. The nitrogen polar c-plane is polished with lapping using diamond slurry. The final lapping step uses diamond slurry with 0.5 micron average size. Then, the Ga polar c-plane is coated with silver using an electron beam evaporator. The thickness of the silver layer is approximately 0.1 microns. This seed crystal is loaded in an ammonothermal reactor to grow bulk GaN on the nitrogen polar c-plane. A bulk crystal of GaN is grown at about 550° C. by using a conventional ammonothermal growth. An example of the conventional ammonothermal growth is disclosed in U.S. Utility Patent Application Ser. No. 61/058,910, issued as U.S. Pat. No. 8,236,237. Each of these is incorporated by reference herein in their entirety as if put forth in full below.

After the growth, a bulk crystal of GaN having thickness of approximately 5 mm is grown on the nitrogen polar c-plane of the seed. Also, the lateral size of the crystal increases by about 500 microns. Then, the bulk crystal is sliced with a multiple wire saw. Since the as grown surface of nitrogen polar c-plane has some roughness, the crystal is mounted on the Ga-polar c-plane. Using the wire pitch of 670 microns, m-plane GaN strips having thickness of about 500 microns are obtained. The miscut angle was within +/−5 degrees. The m-plane GaN strips have exposed nitrogen polar c-plane, m-planes and a-plane. The Ga polar c-plane is covered with the silver mask. The width of the strips is approximately 5 mm.

The m-plane GaN strips are now mounted on a lapping base with wax. Six strips are mounted so that the exposed m-planes of several pieces are lapped at one time. Then, the other side of the strips is lapped in the same way, followed by CMP. Since nonpolar/semipolar planes shows different CMP characteristics than that on the Ga-polar c-planes, the polishing conditions are adjusted to obtain reasonably smooth surface of m-planes.

Then, the six strips are mounted on a silver coated frame made of Ni—Cr superalloy. In this example, the entire exposed surface of the frame is coated with silver; however, the frame can have uncoated portion up to about 10% as long as the deposition of GaN on the frame does not disturb the crystal growth on the strips. The strips are mounted with clamping plates and screws. The frame has guiding grooves so that the metal side of the strip is aligned against the groove. This way, the misalignment of the strips is maintained less than 1 degree or more preferably 0.1 degrees. The lapping and CMP process of the strips also help to provide uniform thickness of the strips, thus helping the clamping work. The spacing of the strips is about 5 mm, i.e. the distance between the nitrogen polar c-plane to the metal of the adjacent strip is approximately 5 mm.

After mounting the strips on the frame, it is loaded into the ammonothermal reactor. Similar to the bulk GaN growth, GaN is grown on nitrogen polar c-plane until it reaches the metal surface of the adjacent piece. During this c-plane growth, stacking faults are not newly introduced. Upon coalescence, however, stacking faults are introduced. Therefore, more than 90% of the stacking faults exist over the metal region, forming bundles. With this configuration, the separation of the stacking fault bundles is about 10 mm. After growing approximately 5 mm on the nitrogen polar c-plane, the growth thickness along the m-plane is about 500 microns. The total thickness of the piece of GaN crystal becomes about 1.5 mm along the m-direction.

After removing the piece of GaN crystal from the frame, the piece of crystal is shaped into a round shape and the backside (a second side) of the piece is ground to remove the metal masks, leaving a m-plane GaN substrate having diameter of 2" and thickness of 450 microns. Then, the first side of the substrate is lapped and polished.

EXAMPLE 2

Instead of slicing the bulk GaN in Example 1 along m-plane, it is sliced along semipolar (10-1-2) plane with miscut angle less than +/−4 degrees. Following the similar steps in Example 1, a semipolar (10-1-2) GaN substrate is fabricated.

EXAMPLE 3

Similar to the Example 1, a piece of GaN crystal is fabricated and removed from the frame. Then, by using a wire saw, the piece is sliced into half to make two m-plane GaN substrates. The surface exposing the metal was ground to remove the metal portion and then, the other side is lapped and polished to make two m-plane GaN substrates.

EXAMPLE 4

Instead of using the ammonothermal method to make the bulk GaN crystal, HVPE is used in this example. C-plane sapphire is used as a seed crystal. C-plane GaN layer is grown on c-plane sapphire at about 1000° C. in a HVPE reactor with appropriate buffer layer in between. One example of HVPE growth reactor is found in a U.S. Pat. No. 8,764,903 B2. After growing approximately 5 mm-thick GaN on sapphire, it was removed from the HVPE reactor. Then, the sapphire is removed by grinding. It takes about 2 hours to remove the sapphire seed of about 450 microns. Also, the rough surface of the as-grown Ga-polar c-plane is flattened with grinding followed by sputtering of silver on it. The thickness of the silver is about 0.5 microns. The nitrogen polar c-plane is lapped and polished to obtain epi-ready surface. After this, the bulk GaN crystal with metal mask on the Ga-polar surface is sliced with a wire saw, and similar to the steps in Example 1, m-plane GaN substrate is obtained.

Advantages and Improvements

The nonpolar/semipolar group III nitride substrate in this invention provides a large usable area for devices by limiting the number and location of stacking faults. By using the ammonothermal growth of group III nitride on the nitrogen polar c-plane, the plurality of nonpolar/semipolar strips coalesces without forming polycrystals at the coalescence front. Also, this scheme does not introduce stacking faults until the nitrogen polar c-plane reaches the metal of the adjacent strip. The nonpolar/semipolar group III nitride substrate in this invention enables to fabricate light emitting devices having longer emission wavelength and other devices having different characteristics than those on c-plane GaN.

Possible Modifications

Although the example describes crystals of GaN, similar benefit of this invention can be expected for other group III nitride alloys of various composition, such as AlN, AlGaN, InN, InGaN, or GaAlInN.

Although the preferred embodiment describes ammonothermal growth and HVPE as a bulk growth method, other methods such as a flux method or high-pressure solution growth can be used.

Although the preferred embodiment describes spacing of the nonpolar/semipolar strips is 5 mm, other dimensions can be selected as long as the coalescence occurs. For example, if the thickness of the bulk crystal is about 0.5 mm, and the spacing is 0.5 mm, after coalescence the spacing of the stacking fault bundle becomes about 1 mm. Likewise, 2.5 mm-wide strips with 2.5 mm spacing will make 5 mm separation of the stacking fault bundles. In addition, the width and spacing can be different value, such as 2 mm-wide strips with 5 mm spacing.

Although the preferred embodiment describes a substrate a diameter of 2", similar benefit of this invention is expected for a larger diameter such as 4", 6" and larger.

Although the preferred embodiment describes a metal thickness of 0.1 microns or 0.5 microns, other thickness can be selected as long as the metal works as a stable mask. For example, if silver plating is used, the thickness is about 1 micron or more.

Although the preferred embodiment describes m-plane and (10-1-2) plane substrate, similar benefit of this invention is expected for any nonpolar, semipolar planes including a{11-20}, {11-22}, {11-2-2}, {10-13}, {10-1-3}, {20-21}, {20-2-1} planes.

Although the example describes a grinder to remove the sapphire seed, laser lift-off or other methods can be used to remove the seed.

Following are various examples of processes, machines, articles of manufacture, and/or compositions of matter that illustrate certain embodiments of but do not limit the scope of the claimed invention:

1. A crystalline group III nitride substrate comprising,
    (a) a first side exposing nonpolar or semipolar plane of group III nitride;
    (b) a second side opposite to the first side exposing nonpolar or semipolar plane of group III nitride;
    (c) bundles of stacking faults perpendicular to c-axis with separation larger than 1 mm.
2. A group III nitride substrate of paragraph 1 wherein the separation is larger than 5 mm.
3. A group III nitride substrate of paragraph 1 or paragraph 2, wherein the width of the bundles of stacking faults is between 0.05 microns and 1000 microns.
4. A group III nitride substrate of any one of paragraphs 1-3 wherein the bundles are linear.
5. A group III nitride substrate comprising,
    (a) a first side exposing nonpolar or semipolar plane of group III nitride;
    (b) a second side opposite to the first side and containing a plurality of metal stripes buried in the group III nitride of the second side, and wherein the direction of the plurality of stripes is perpendicular to c-axis of the group III nitride.
6. A group III nitride substrate of paragraph 5 wherein the second side has an exposed nonpolar or semipolar plane.
7. A group III nitride substrate of paragraph 6 wherein the metal stripes are linear.
8. A group III nitride substrate according to any one of paragraphs 1 through 7, wherein the first side is polished to obtain a suitable surface for epitaxial growth of group III nitride.
9. A group III nitride substrate according to any one of paragraphs 1 through 8, wherein the first side is selected from nonpolar m{10-10} plane or a{11-20} plane with miscut angle less than +/−5 degrees.
10. A group III nitride substrate according to any one of paragraphs 1 through 8, wherein the first side is selected from semipolar {11-22}, {11-2-2}, {10-13}, {10-1-3}, {20-21}, {20-2-1} planes with miscut angle less than +/−5 degrees.
11. A group III nitride substrate according to any one of paragraphs 5 through 10, wherein the metal is vanadium or a vanadium-containing alloy.
12. A group III nitride substrate according to any one of paragraphs 5 through 10, wherein the metal is selected from nickel or a nickel-containing alloy.
13. A group III nitride substrate according to any one of paragraphs 5 through 10, wherein the metal is silver or a silver-containing alloy.
14. A group III nitride substrate according to any one of paragraphs 5 through 13, wherein the width of the stripes of metal is between 0.05 microns and 1000 microns.
15. A group III nitride substrate according to any one of paragraphs 5 through 14, wherein the spacing between adjacent stripes is greater than 1 mm.
16. A group III nitride substrate according to paragraph 15, wherein the spacing between adjacent stripes is greater than 5 mm.
17. A group III nitride substrate according to any one of paragraphs 5 through 16, wherein more than 90% of stacking faults of group III nitride exist over the regions of stripes of metal.
18. A group III nitride substrate according to any one of paragraphs 1 through 17, wherein the group III nitride is GaN.
19. A plurality of strips of group III nitride having a metal coating on a first long edge of each of the strips and no metal coating on a second long edge of each of the strips.
20. The plurality of strips of paragraph 19 wherein a crystal plane of said first edge is group III polar c-plane and said second edge is nitrogen polar c-plane.
21. The plurality of strips of paragraph 19 or 20 wherein the group III nitride material of the group III nitride strips contains a mineralizer.
22. A piece comprising a first strip and a second strip of said plurality of any of paragraphs 19-21 merged together with additional group III nitride on the second long edge of the first strip such that the new group III nitride contacts the metal coating on the first long edge of the second strip.
23. A method of fabricating a nonpolar or semipolar group III nitride substrate comprising
    (a) positioning a first group III nitride piece having a first face a distance from a second group III nitride piece so that fast-growing edges of the pieces face one another across a gap, and
    (b) growing group III nitride on one but not the other of the fast-growing edges facing one another in order to fill the gap with group III nitride.
24. A method according to paragraph 23 wherein the method further comprises continuing to grow group III nitride to merge the pieces into a single substrate, and growing additional group III nitride on a face formed by the merged pieces.
25. A method according to paragraph 23 or paragraph 24, wherein the first and second group III nitride pieces are formed from a masked substrate that is cut to form said first and second group III nitride pieces.
26. A method according to paragraph 25 wherein the substrate is masked on a group-III polar c-plane.
27. A method according to paragraph 25 or paragraph 26 wherein the mask is a metal covering.
28. A method according to any one of paragraphs 23-27 wherein the pieces are formed by an ammonothermal method.
29. A method according to any one of paragraphs 23-28 wherein the act of growing the group III nitride on one but not the other of the fast-growing edges is performed by an ammonothermal method.
30. A method according to paragraph 29 wherein the ammonothermal method is an ammonobasic method.
31. A method according to any one of paragraphs 23-30 wherein the first and second group III nitride pieces are formed by slicing a group III nitride bulk crystal along a nonpolar or semipolar plane to obtain a plurality of strips of group III nitride crystals, wherein the bulk crystal has a thickness of at least 0.5 mm and has a metal covering on a group III polar c-plane surface of the bulk crystal, and wherein the metal covering covers a group III polar c-plane surface of each of the strips.
32. A method according to any one of paragraphs 23-31 wherein the first and second pieces are aligned to keep the same crystallographic orientation facing the same direction and fixed to a frame with spacing between the pieces so that at least nonpolar or semipolar planes and nitrogen polar c-planes are exposed.
33. A method according to any one of paragraph 23-32 wherein the act of growing the group III nitride is performed in supercritical ammonia so that growth on the nitrogen polar c-plane fills the spacing to merge the pieces and form the group III nitride substrate.

34. A method according to paragraph 31 wherein the group III nitride bulk crystal with its metal covering is formed by growing a bulk crystal on a c-plane seed crystal and subsequently covering the group III polar c-plane surface of the crystal with the metal covering.

35. A method according to paragraph 31 wherein the group III nitride bulk crystal with its metal covering is formed by growing a bulk crystal of group III nitride on a c-plane seed crystal having its group III polar c-plane covered with the metal.

36. A method according to any one of paragraphs 23 through 35, wherein the act of growing the group III nitride also grows the group III nitride on an exposed nonpolar or semipolar plane.

37. A method according to any one of paragraphs 25 through 36, wherein the mask or the covering of the group III polar surface is selected from vanadium, vanadium-containing alloys, nickel, nickel-containing alloys, silver or silver-containing alloys.

38. A method according to any one of paragraphs 32 through 37, wherein the frame is made of a metal which is stable in supercritical ammonia and on which deposition of group III nitride is inhibited.

39. A method according to paragraph 38 wherein more than about 90% of the exposed surface of the frame is covered by the metal, and the metal is selected from vanadium, vanadium-containing alloys, nickel, nickel-containing alloys, silver or silver-containing alloys.

40. A method according to any one of paragraphs 23 through 39, wherein the nitrogen polar c-planes are polished before the step (b) of paragraph 23.

41. A method according to any one of paragraphs 23 through 40, wherein the nonpolar or semipolar planes are polished before the step (b).

42. A method according to any one of paragraphs 25 through 41 further comprising a grinding step to remove a portion of the piece containing the mask or metal covering.

43. A method according to any one of paragraphs 23 through 42, further comprising a slicing step to slice the group III nitride crystal substrate into two or more nonpolar/semipolar group III nitride substrates.

44. A method of fabricating a nonpolar/semipolar group III nitride substrate comprising;
(a) growing a bulk crystal of group III nitride having thickness greater than 0.5 mm on a c-plane seed crystal;
(b) covering the group III polar c-plane surface of the bulk crystal with metal;
(c) slicing the group III nitride bulk crystal along a nonpolar/semipolar plane to obtain plurality of strips of group III nitride crystals with the metal covering the group III polar surface;
(d) aligning and fixing the sliced strips on a frame by keeping the same crystallographic orientation facing to the same direction with spacing between the strips so that at least nonpolar/semipolar planes and nitrogen polar c-planes are exposed;
(e) growing group III nitride in supercritical ammonia so that growth on the nitrogen polar c-plane fill the spacing to form a piece of group III nitride crystal.

45. A method of fabricating a nonpolar/semipolar group III nitride substrate comprising;
(a) preparing a c-plane seed crystal of group III nitride with group III polar c-plane surface is covered with metal;
(b) growing a bulk crystal of group III nitride having thickness greater than 0.5 mm on nitrogen polar c-plane of the seed in supercritical ammonia;
(c) slicing the group III nitride bulk crystal along a nonpolar/semipolar plane to obtain plurality of strips of group III nitride crystals with the metal covering the group III polar surface;
(d) aligning and fixing the sliced strips on a frame by keeping the same crystallographic orientation facing to the same direction with a spacing between the strips so that at least nonpolar/semipolar planes and nitrogen polar c-planes are exposed;
(e) growing group III nitride in supercritical ammonia so that growth on the nitrogen polar c-plane fill the spacing to form a piece of group III nitride crystal.

46. A method of fabricating a nonpolar/semipolar group III nitride substrate according to paragraph 44 or paragraph 45, wherein group III nitride is also grown on the exposed nonpolar/semipolar plane in step (e).

47. A method of fabricating a nonpolar/semipolar group III nitride substrate according to any one of paragraphs 44 through 46, wherein the metal covering the group III polar surface is selected from vanadium, vanadium-containing alloys, nickel, nickel-containing alloys, silver or silver-containing alloys.

48. A method of fabricating a nonpolar/semipolar group III nitride substrate according to any one of paragraphs 44 through 47, wherein the frame is made of metal which is stable in supercritical ammonia and on which deposition of group III nitride is inhibited.

49. A method of fabricating a nonpolar/semipolar group III nitride substrate according to any one of paragraphs 44 through 47, wherein more than about 90% of the exposed surface of the frame is vanadium, a vanadium-containing alloy, nickel, a nickel-containing alloy, silver or a silver-containing alloy.

50. A method of fabricating a nonpolar/semipolar group III nitride substrate according to any one of paragraphs 44 through 49, wherein the nitrogen polar c-planes are polished before the step (d).

51. A method of fabricating a nonpolar/semipolar group III nitride substrate according to any one of paragraphs 44 through 50, wherein. the nonpolar/semipolar planes are polished before the step (d).

52. A method of fabricating a nonpolar/semipolar group III nitride substrate according any one of paragraphs 44 through 51, further comprising a grinding step to remove the metal portion of the piece of group III nitride crystal.

53. A method of fabricating a nonpolar/semipolar group III nitride substrate according any one of paragraphs 44 through 51, further comprising a slicing step to slice the piece of group III nitride crystal into two or more nonpolar/semipolar group III nitride substrates.

Variations on these and other embodiments as disclosed herein are recognizable by one skilled in the art, and these variations are also within the scope of the invention disclosed herein. Consequently, the claims are to be accorded a broad interpretation, consistent with the disclosure of the new technology and principles disclosed herein.

What is claimed is:

1. A group III nitride substrate comprising,
   (a) a first side exposing nonpolar or semipolar plane of group III nitride;
   (b) a second side opposite to the first side and containing a plurality of metal stripes buried in the group III nitride of the second side, and wherein the direction of the plurality of stripes is perpendicular to c-axis of the group III nitride; and
   (c) wherein more than 90% of stacking faults of group III nitride exist over the regions of stripes of metal.

2. A group III nitride substrate of claim 1 wherein the second side has an exposed nonpolar or semipolar plane.

3. A group III nitride substrate of claim 2, wherein the metal stripes are linear.

4. A group III nitride substrate according to claim 3, wherein the first side is polished to obtain a suitable surface for epitaxial growth of group III nitride.

5. A group III nitride substrate according to claim 1, wherein the first side is selected from nonpolar m{10-10} plane or a{11-20} plane with a miscut angle within +/−5 degrees.

6. A group III nitride substrate according to claim 1, wherein the first side is selected from semipolar {11-22}, {11-2-2}, {10-13}, {10-1-3}, {20-21}, {20-2-1} planes with a miscut angle within +/−5 degrees.

7. A group III nitride substrate according to claim 1, wherein the metal is vanadium or a vanadium-containing alloy.

8. A group III nitride substrate according to claim 1, wherein the metal is selected from nickel or nickel-containing alloys.

9. A group III nitride substrate according to claim 1, wherein the metal is silver or a silver-containing alloy.

10. A group III nitride substrate according to claim 1, wherein the width of the stripes of metal is between 0.05 microns and 1000 microns.

11. A group III nitride substrate according to claim 1, wherein the spacing between adjacent stripes is greater than 1 mm.

12. A group III nitride substrate according to claim 11, wherein the spacing between adjacent stripes is greater than 5 mm.

13. A group III nitride substrate according to claim 1, wherein the group III nitride is GaN.

* * * * *